United States Patent
Lee et al.

(10) Patent No.: US 6,862,545 B1
(45) Date of Patent: Mar. 1, 2005

(54) LINEWIDTH MEASUREMENT TOOL CALIBRATION METHOD EMPLOYING LINEWIDTH STANDARD

(75) Inventors: Pey-Yuan Lee, Tainan (TW); Hong-Ji Yang, Kaohsiung (TW); Yi-Hung Chen, Kaohsiung (TW); Chi-Shen Lo, Tainan (TW); Chen-Ning Fuh, Taipei (TW); Wen-Chung Lee, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/406,988

(22) Filed: Apr. 3, 2003

(51) Int. Cl.[7] .............................................. G06F 19/00
(52) U.S. Cl. ........................................ 702/97; 702/85
(58) Field of Search ........................... 702/85, 97, 127, 702/155, 158, 33, 35, 170, 172, 198, 199; 73/1.81, 865.8; 250/306, 310, 492.1; 355/53; 356/496, 601, 614, 625, 626, 630, 634, 635, 636; 430/30, 296, 313, 109, 110, 120, 121, 303; 438/9, 14, 16, 17, 18; 700/90, 95, 96, 108; 716/19

(56) References Cited

U.S. PATENT DOCUMENTS

| | | | | |
|---|---|---|---|---|
| 585,211 A | * | 6/1897 | Johnson et al. ................ 111/73 |
| 665,623 A | * | 1/1901 | Pasadyn et al. ................ 53/306 |
| 4,050,821 A | * | 9/1977 | Cuthbert et al. ............. 356/636 |
| 4,385,837 A | * | 5/1983 | Schram ....................... 356/636 |
| 4,744,665 A | * | 5/1988 | Kirk ............................ 356/636 |
| 4,766,311 A | * | 8/1988 | Seiler et al. ............. 250/252.1 |
| 4,767,926 A | * | 8/1988 | Murakoshi et al. .......... 250/310 |
| 5,479,238 A | * | 12/1995 | Whitney ........................ 355/53 |
| 5,644,132 A | * | 7/1997 | Litman et al. .............. 250/310 |
| 5,684,301 A | * | 11/1997 | Cresswell et al. ........... 250/306 |
| 5,804,460 A | * | 9/1998 | Bindell et al. ................. 438/16 |
| 5,835,227 A | * | 11/1998 | Grodnensky et al. ........ 356/399 |
| 5,920,067 A | * | 7/1999 | Cresswell et al. ........... 250/306 |
| 5,969,273 A | | 10/1999 | Archie et al. |
| 6,043,496 A | * | 3/2000 | Tennant .................... 250/492.1 |
| 6,258,610 B1 | | 7/2001 | Blatchford et al. |
| 6,323,938 B1 | * | 11/2001 | Grodnensky et al. .......... 355/77 |
| 6,373,053 B1 | | 4/2002 | Choo et al. |
| 6,458,605 B1 | * | 10/2002 | Stirton ........................... 438/7 |
| 6,479,309 B1 | * | 11/2002 | Wright ......................... 438/16 |
| 6,570,157 B1 | * | 5/2003 | Singh et al. ................. 250/311 |
| 6,614,540 B1 | * | 9/2003 | Stirton ........................ 356/630 |
| 6,625,512 B1 | * | 9/2003 | Goodwin .................... 700/121 |
| 6,646,737 B2 | * | 11/2003 | Tortonese et al. ......... 356/243.4 |

* cited by examiner

*Primary Examiner*—John Barlow
*Assistant Examiner*—Douglas N Washburn
(74) *Attorney, Agent, or Firm*—Tung & Associates

(57) ABSTRACT

A method for calibrating a linewidth measurement tool and a system for calibrating the linewidth measurement tool each employ a correction of a series of periodic actual measurements of at least one single measurement location of a topographic feature within a linewidth standard with an exponentially weighted moving average of a series of deviations of the series of periodic actual measurements from a corresponding series of regressed data points derived from mathematical regression of the series of periodic actual measurements. Such a correction provides for a more accurate calibration of the linewidth measurement tool and a more accurate measurement of linewidths within microelectronic products while employing the calibrated linewidth measurement tool.

23 Claims, 3 Drawing Sheets

| No(i) | (Bias)$_i$ | EWMA((Bias)$_i$) |
|---|---|---|
| 1 | (Bias)$_1$ | EWMA((Bias)$_1$) = $\lambda \times$ (Bias)$_1$ |
| 2 | (Bias)$_2$ | EWMA((Bias)$_2$) = $\lambda \times$ (Bias)$_2$ + $\lambda(1-\lambda) \times$ (Bias)$_1$ |
| 3 | (Bias)$_3$ | EWMA((Bias)$_3$) = $\lambda \times$ (Bias)$_3$ + $\lambda(1-\lambda) \times$ (Bias)$_2$ + $\lambda(1-\lambda)^2 \times$ (Bias)$_1$ |
| . | . | |
| a-1 | (Bias)$_{a-1}$ | EWMA((Bias)$_{a-1}$) = $\lambda \times$ (Bias)$_{a-1}$ + $\lambda(1-\lambda) \times$ (Bias)$_{a-2}$ + ... + $\lambda(1-\lambda)^{a-2} \times$ (Bias)$_1$ |
| a | (Bias)$_a$ | EWMA((Bias)$_a$) = $\lambda \times$ (Bias)$_a$ + $\lambda(1-\lambda) \times$ (Bias)$_{a-2}$ + ... + $\lambda(1-\lambda)^{a-1} \times$ (Bias)$_1$ |

*Figure 7*

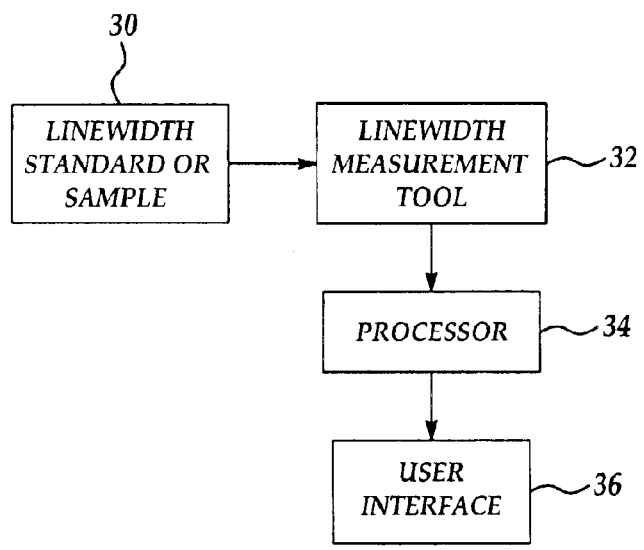

*Figure 8*

LINEWIDTH MEASUREMENT TOOL CALIBRATION METHOD EMPLOYING LINEWIDTH STANDARD

BACKGROUND OF THE INVENTION

1. Field of the Invention

The present invention relates generally to linewidth measurement methods employed when fabricating microelectronic products. More particularly, the present invention relates to linewidth standard based linewidth measurement methods employed when fabricating microelectronic products.

2. Description of the Related Art

Significant in the microelectronic product fabrication art is a need to monitor and control dimensions (i.e., critical dimensions) of patterned layers and patterned structures which are employed when fabricating microelectronic products. Such monitoring and control of dimensions of patterned layers and patterned structures is in turn important insofar as performance characteristics of microelectronic products are often defined at least in part by dimensional characteristics of patterned layers and patterned structures which comprise the microelectronic products.

While patterned layer dimension monitoring and control is thus desirable and often essential in the microelectronic product fabrication art, such monitoring and control is nonetheless not entirely without problems. In that regard, it is often difficult to accurately monitor and control linewidth when fabricating microelectronic products.

It is thus desirable in the microelectronic product fabrication art to accurately monitor and control linewidth when fabricating microelectronic products.

It is towards the foregoing object that the present invention is directed.

Various apparatus and methods have been disclosed in the microelectronic product fabrication art for monitoring linewidth when fabricating microelectronic products.

Included but not limiting among the apparatus and methods are those disclosed within: (1) Archie et al., in U.S. Pat. No. 5,969,273 (an apparatus and method for critical dimension linewidth monitoring when fabricating microelectronic products by employing an edge width determination for a patterned layer); (2) Blatchford et al., in U.S. Pat. No. 6,258,610 (a method for patterned layer dimension determination within a microelectronic product while employing an auto-correlation); and (3) Choo et al., in U.S. Pat. No. 6,373,053 (a method for analyzing scanning electron microscopy measurements such as to determine scummed or closed structures or features within microelectronic products).

The teachings of each of the foregoing references are incorporated herein fully by reference.

Desirable in the microelectronic product fabrication art are additional apparatus and methods for linewidth monitoring when fabricating microelectronic products.

It is towards the foregoing object that the present invention is directed.

SUMMARY OF THE INVENTION

A first object of the invention is to provide a method for monitoring a linewidth of a patterned layer when fabricating a microelectronic product.

A second object of the invention is to provide a method in accord with the first object of the invention, wherein the method provides for accurate monitoring of the linewidth of the patterned layer.

In accord with the objects of the invention, the invention provides a method for calibrating a linewidth measurement tool.

The method first provides a linewidth standard comprising a series of topographic features. The method next provides for measuring periodically within at least one single location within the linewidth standard a linewidth of a topographic feature while employing a linewidth measurement tool, such as to obtain a series of periodic actual measurements. The method next provides for mathematically regressing the series of periodic actual measurements to obtain a corresponding series regressed data points. The method next provides for determining a series of deviations between the series of periodic actual measurements and the series of regressed data points. The method next provides for determining from the series of deviations a series of exponentially weighted moving averages for the series of periodic actual measurements. Finally, the method provides for correcting each of the periodic actual measurements by a corresponding exponentially weighted moving average to provide a series of corrected periodic actual measurements.

The method of the invention contemplates a system which operates in accord with the method of the invention.

Once a linewidth measurement tool has been calibrated in accord with the invention, a linewidth of a sample may be more accurately measured with the calibrated linewidth measurement tool.

The present invention provides a method for monitoring a linewidth of a patterned layer when fabricating a microelectronic product, wherein the method provides for accurate monitoring of the linewidth of the patterned layer.

The invention realizes the foregoing object by correcting each of a series of periodic actual measurements of at least a single measurement location of a topographic feature within a linewidth standard with an exponentially weighted moving average of a series of deviations of the series of periodic actual measurements from a corresponding series of regressed data points derived from mathematical regression of the series of periodic actual measurements.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein:

FIG. 7 shows a table of equations employed for calculating a series of exponentially weighted moving averages employed in accord with the invention.

FIG. 8 shows a schematic block diagram of a system in accord with the invention.

DESCRIPTION OF THE PREFERRED EMBODIMENT

The present invention provides a method for monitoring a linewidth of a patterned layer when fabricating a microelectronic product, wherein the method provides for accurate monitoring of the linewidth of the patterned layer.

The invention realizes the foregoing object by correcting each of a series of periodic actual measurements of at least one single measurement location of a topographic feature within a linewidth standard with an exponentially weighted moving average of a series of deviations of the series of periodic actual measurements from a corresponding series of regressed data points derived from mathematical regression of the series of periodic actual measurements.

Figure 1:
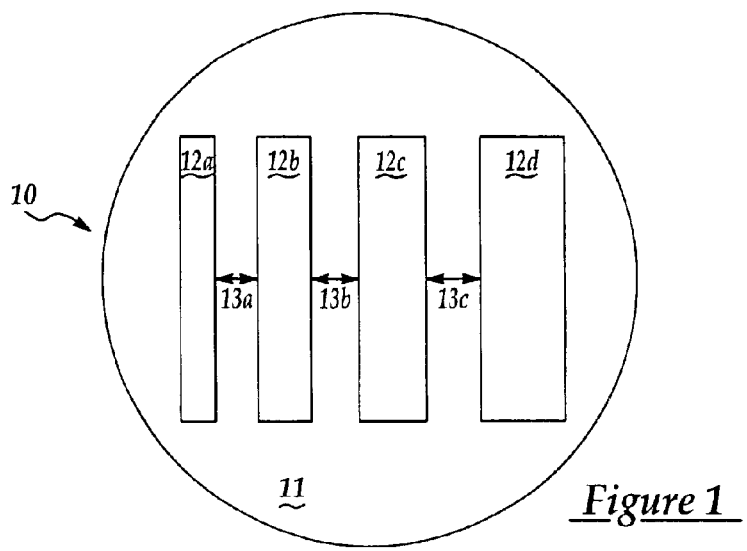
FIG. 1 shows a schematic plan view diagram of a linewidth standard which may be employed within the context of the invention.

FIG. 1 illustrates a schematic plan view diagram of a linewidth standard which may be employed within the context of the invention.

Within FIG. 1, a linewidth standard 10 comprises a substrate 11 having formed thereupon a series of lines 12a, 12b, 12c and 12d separated by a series of gaps 13a, 13b and 13c.

Within the invention, either the series of lines 12a, 12b, 12c and 12d or the series of gaps 13a, 13b and 13c may comprise a series of topographic features which is measured in accord with the invention. Typically, at least one of the series of lines 12a, 12b, 12c and 12d and the series of gaps 13a, 13b and 13c approximates a critical dimension of a patterned layer within a microelectronic product which is measured with a linewidth measurement tool which is calibrated in accord with the invention. Each of the series of lines 12a, 12b, 12c and 12d and the series of gaps 13a, 13b and 13c may be of the same or different linewidth. Each of the substrate 11 and the series of lines 12a, 12b, 12c and 12d may be formed of microelectronic materials selected from the group including but not limited to conductor materials, semiconductor materials and dielectric materials.

Figure 2:
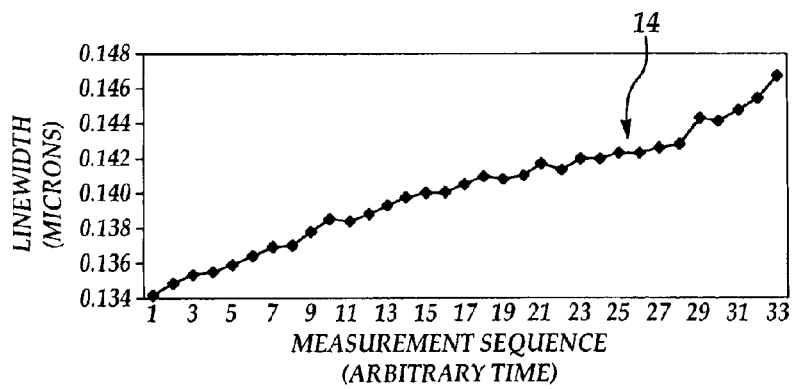
FIG. 2, FIG. 3, FIG. 4, FIG. 5 and FIG. 6 show a series of graphs of linewidth, bias, P-value and exponentially weighted moving average measured or calculated data points versus measurement sequence, as may be employed for calibrating a linewidth measurement tool in accord with the invention.

For purposes of illustrating the invention by example, FIG. 2 shows a graph of linewidth versus measurement sequence for average measurement of a series of five polysilicon lines of identical nominal 0.13 micron linewidth within a single linewidth standard as a function of measurement sequence. The single linewidth standard may be in accord with the linewidth standard 10 as illustrated in FIG. 1. The measurement sequence is arbitrarily determined and is typically a daily measurement sequence, but the invention is not limited to any particular measurement sequence timescale. Within the invention, the linewidths of the series of five identical lines within the single linewidth standard are measured employing a scanning electron microscope measurement apparatus, although the present invention is not intended to be specifically so limited. The present may also be employed for calibrating linewidth measurement tools which employ non-electron optical linewidth determination means, as well as mechanical linewidth determination means.

As is illustrated in FIG. 2, the measured linewidths 14 (i.e., periodic actual measurements) as a function of measurement sequence is seen to increase, generally linearly. Such an increase when measuring a linewidth of a series of identical lines within a linewidth standard while employing a scanning electron microscope linewidth measurement tool is believed due to an electron beam radiation induced linewidth broadening of the series of identical lines.

Figure 3:
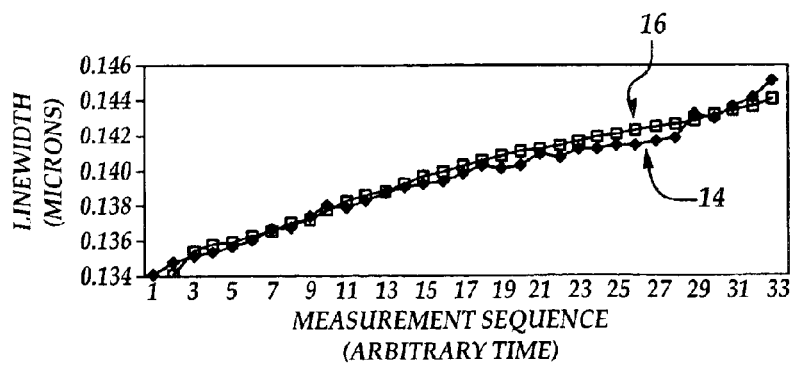

FIG. 3 shows a graph of linewidth versus measurement sequence in accord with the graph of FIG. 2, but wherein in addition to the series of measured linewidths 14 there is also shown a series of regressed data points 16 which result from mathematical regression of the series of measured linewidths 14. Within the invention, the mathematical regression is typically a linear regression, but the invention is not strictly limited to a linear regression under situations where the series of measured linewidths 14 does not generally approximate a linear progression.

Within the invention, the linear regression is determined employing mathematic methods as are conventional in the statistical analysis art. Such methods which will typically and preferably employ a determination of a slope and an intercept for the series of regressed data points 16 such that a sum of a series of squares of a series of deviations of the series of regressed data points 16 from the series of measured linewidths 14 is kept to a minimum.

Figure 4:
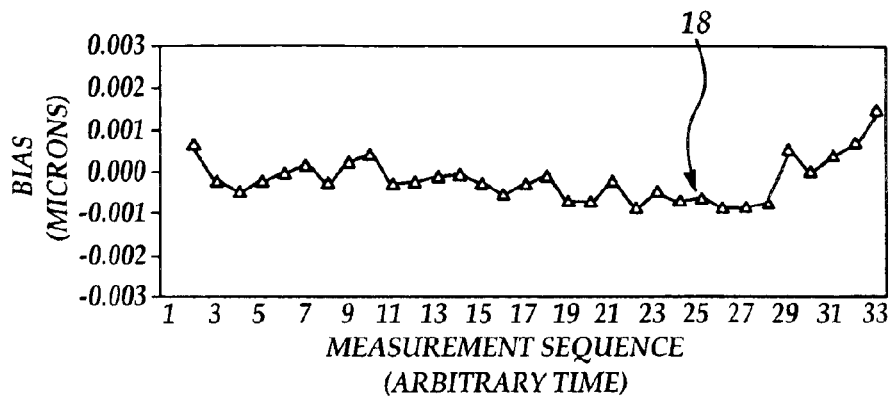

FIG. 4 shows a graph of bias (i.e., difference or deviation between a measured linewidth data point and a corresponding regressed data point) versus measurement sequence.

The graph of FIG. 4 is derived from the graph of FIG. 3 by calculating the appropriate series of deviations 18.

Figure 5:
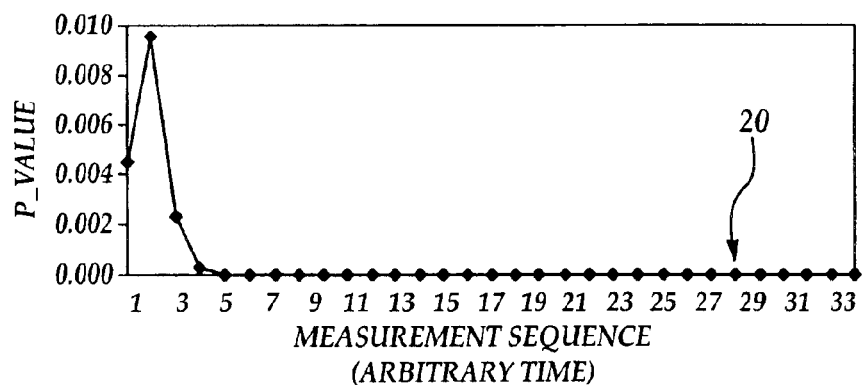

FIG. 5 shows a graph of P-value versus measurement sequence for the bias deviations as shown in FIG. 4.

P-value is a probability value which is intended to indicate whether the linear slope of the regressed data points 16 as illustrated in FIG. 3 is statistically significant. In general, a P-value of less than 0.005 is understood to indicate statistical significance. P-values 20 may be calculated employing statistical methods as are generally conventional in statistical analysis art.

The calculation and use of a P-value is optional in the present invention, but the calculation and evaluation of a P-value provides additional validity of qualification of a linewidth measurement tool in accord with the invention. Similarly, a lack of timely convergence of P-value (to zero or below a threshold value) may provide rational for disqualification of a data set when qualifying a linewidth measurement tool in accord with the invention.

Figure 6:
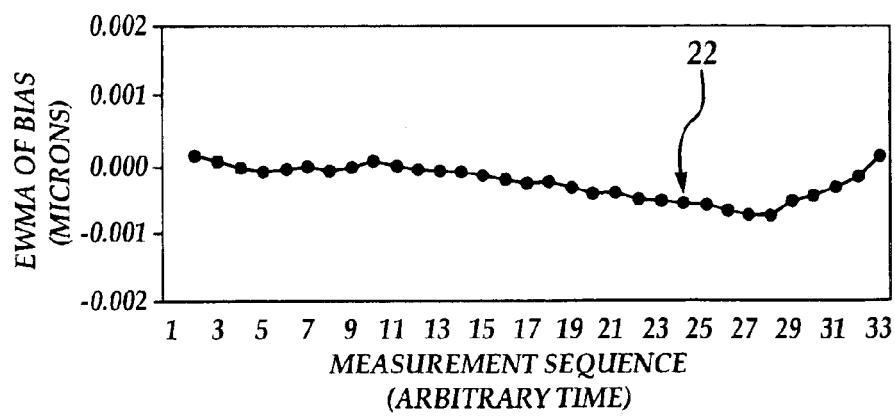

FIG. 6 shows a graph of exponentially weighted moving average (EWMA) values 22 versus measurement sequence as derived from the series of bias data points 18 as illustrated in FIG. 4. Exponentially weighted moving average values 22 are calculated in accord with the equations as illustrated in the table of FIG. 7. Within the equations as illustrated in the table of FIG. 7, is an arbitrarily determined smoothing factor, generally in a range of from 0 to 1.

Within the invention, each of the measured linewidths 14 as illustrated in FIG. 2 or FIG. 3 is corrected by a corresponding exponentially weighted moving average value 22 to provide a series of corrected measured linewidths as a function of measurement sequence. The corrected measured linewidths provide a more effective and accurate calibration of a linewidth measurement tool. In turn, the more effective calibration of the linewidth measurement tool provides for a more accurate measurement of sample linewidths of patterned layers within microelectronic products which are measured while employing the linewidth measurement tool. Such microelectronic products whose patterned layer linewidths are measured may include, but are not limited to, semiconductor products and ceramic substrate products.

FIG. 8 shows a schematic block diagram of a system in accord with the invention.

FIG. 8 illustrates a linewidth measurement tool 32 into which is introduced a linewidth standard or a sample 30 in accord with the method of the invention. Within the system as illustrated in FIG. 8, data from the linewidth measurement tool 32 is processed in a processor 34 which provides all of the mathematical data manipulations in accord with the method of the invention. The processor 34 is typically a computer processor, more typically a digital computer processor. Finally, FIG. 8 illustrates a user interface 36 connected with the processor such as to provide user access to data and information in accord with the invention.

The preferred embodiment of the invention is illustrative of the invention rather than limiting of the invention. Revisions and modifications may be made to dimensions and calculations in accord with the preferred embodiment of the invention, while still providing a method and a system in accord with the invention, further in accord with the accompanying claims.

What is claimed is:

1. A method for calibrating a linewidth measurement tool while employing a linewidth standard comprising:

providing a linewidth standard comprising a series of topographic features;

measuring periodically within at least one single location within the linewidth standard a linewidth of a topographic feature while employing a linewidth measurement tool, to thus obtain a series of periodic actual measurements;

mathematically regressing the series of periodic actual measurements to obtain a corresponding series regressed data points;

determining a series of deviations between the series of periodic actual measurements and the series of regressed data points;

determining from the series of deviations a series of exponentially weighted moving averages for the series of periodic actual measurements; and correcting each of the periodic actual measurements by a corresponding exponentially weighted moving average to provide a series of corrected periodic actual measurements.

2. The method of claim 1 wherein the series of topographic features is a series of lines.

3. The method of claim 1 wherein the series of topographic features is a series of gaps.

4. The method of claim 1 wherein the measurement tool is a scanning electron microscope.

5. The method of claim 1 wherein the linewidth measurement tool is a non-electron optical linewidth measurement tool.

6. The method of claim 1 wherein the linewidth measurement tool is a mechanical linewidth measurement tool.

7. The method of claim 1 wherein the mathematical regression is a linear mathematical regression.

8. A method for measuring a linewidth within a microelectronic product comprising:

providing:
  a linewidth standard comprising a series of topographic features; and
  a linewidth measurement tool;

measuring periodically within at least one single location within the linewidth standard a linewidth of a topographic feature while employing the linewidth measurement tool, to thus obtain a series of periodic actual measurements;

mathematically regressing the series of periodic actual measurements to obtain a corresponding series regressed data points;

determining a series of deviations between the series of periodic actual measurements and the series of regressed data points;

determining from the series of deviations a series of exponentially weighted moving averages for the series of periodic actual measurements;

correcting each of the periodic actual measurements by a corresponding exponentially weighted moving average to provide a series of corrected periodic actual measurements which serve to provide a calibrated measurement tool; and measuring a linewidth of a patterned layer within a microelectronic product while employing the calibrated measurement tool.

9. The method of claim 8 wherein the series of topographic features is a series of lines.

10. The method of claim 8 wherein the series of topographic features is a series of gaps.

11. The method of claim 8 wherein the measurement tool is a scanning electron microscope.

12. The method of claim 8 wherein the mathematical regression is a linear mathematical regression.

13. The method of claim 8 wherein the microelectronic product is a semiconductor product.

14. The method of claim 8 wherein the microelectronic product is a ceramic substrate product.

15. A system for calibrating a linewidth measurement tool comprising:

means for periodically measuring within at least one single location within a linewidth standard a linewidth of a topographic feature while employing a measurement tool, to thus obtain a series of periodic actual measurements;

means for mathematically regressing the series of periodic actual measurements to obtain a corresponding series regressed data points;

means for determining a series of deviations between the series of periodic actual measurements and the series of regressed data points;

means for determining from the series of deviations a series of exponentially weighted moving averages for the series of periodic actual measurements; and means for correcting each of the periodic actual measurements by a corresponding exponentially weighted moving average to provide a series of corrected periodic actual measurements.

16. The system of claim 15 wherein the series of topographic features is a series of lines.

17. The system of claim 15 wherein the series of topographic features is a series of gaps.

18. The system of claim 15 wherein the measurement tool is a scanning electron microscope.

19. The system of claim 15 wherein the mathematical regression is a linear mathematical regression.

20. The system or claim 15 wherein the system comprises a digital computer processor as a calculation means.

21. A method for calibrating a linewidth measurement tool while employing a linewidth standard comprising:

providing a linewidth standard comprising a series of topographic features;

measuring periodically within only one single location within the linewidth standard a linewidth of a topographic feature while employing a linewidth measurement tool, to thus obtain a series of periodic actual measurements;

mathematically regressing the series of periodic actual measurements to obtain a corresponding series regressed data points;

determining a series of deviations between the series of periodic actual measurements and the series of regressed data points;

determining from the series of deviations a series of exponentially weighted moving averages for the series of periodic actual measurements; and correcting each of the periodic actual measurements by a corresponding exponentially weighted moving average to provide a series of corrected periodic actual measurements.

22. A method for measuring a linewidth within a microelectronic product comprising:

providing:
- a linewidth standard comprising a series of topographic features; and
- a linewidth measurement tool;

measuring periodically within only one single location within the linewidth standard a linewidth of a topographic feature while employing a linewidth measurement tool, to thus obtain a series of periodic actual measurements;

mathematically regressing the series of periodic actual measurements to obtain a corresponding series regressed data points;

determining a series of deviations between the series of periodic actual measurements and the series of regressed data points;

determining from the series of deviations a series of exponentially weighted moving averages for the series of periodic actual measurements;

correcting each of the periodic actual measurements by a corresponding exponentially weighted moving average to provide a series of corrected periodic actual measurements which serve to provide a calibrated measurement tool; and measuring a linewidth of a patterned layer within a microelectronic product while employing the calibrated measurement tool.

23. A system for calibrating a linewidth measurement tool comprising:

means for periodically measuring within at least one single location within a linewidth standard a linewidth of a topographic feature while employing a measurement tool, to thus obtain a series of periodic actual measurements;

means for mathematically regressing the series of periodic actual measurements to obtain a corresponding series regressed data points;

means for determining a series of deviations between the series of periodic actual measurements and the series of regressed data points;

means for determining from the series of deviations a series of exponentially weighted moving averages for the series of periodic actual measurements; and means for correcting each of the periodic actual measurements by a corresponding exponentially weighted moving average to provide a series of corrected periodic actual measurements.

* * * * *